United States Patent
Holder

(10) Patent No.: US 6,652,645 B2
(45) Date of Patent: *Nov. 25, 2003

(54) PROCESS FOR PREPARING A SILICON MELT

(75) Inventor: John Davis Holder, Lake St. Louis, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 120 days.

This patent is subject to a terminal disclaimer.

(21) Appl. No.: 09/943,600

(22) Filed: Aug. 30, 2001

(65) Prior Publication Data

US 2002/0020339 A1 Feb. 21, 2002

Related U.S. Application Data

(63) Continuation of application No. 09/503,566, filed on Feb. 14, 2000, now Pat. No. 6,344,083.

(51) Int. Cl.$^7$ .............................. C30B 15/14
(52) U.S. Cl. .................. 117/13; 117/35; 117/218; 117/932
(58) Field of Search ................ 117/13, 35, 218, 117/932

(56) References Cited

U.S. PATENT DOCUMENTS

| | | | |
|---|---|---|---|
| 4,249,988 A | 2/1981 | Lavigna et al. | |
| 4,591,409 A | 5/1986 | Ziem et al. | |
| 4,705,591 A | 11/1987 | Carle et al. | |
| 5,373,805 A | 12/1994 | Takano et al. | |
| 5,588,993 A | 12/1996 | Holder | |
| 5,676,751 A | 10/1997 | Banan et al. | |
| 5,725,660 A | 3/1998 | Hiraishi | |
| 5,814,148 A | 9/1998 | Kim et al. | |
| 5,913,975 A | 6/1999 | Holder | |
| 5,919,303 A | 7/1999 | Holder | |
| 5,976,247 A | 11/1999 | Hansen et al. | |
| 5,980,629 A | 11/1999 | Hansen et al. | |
| 6,344,083 B1 * | 2/2002 | Holder | 117/13 |

FOREIGN PATENT DOCUMENTS

| | | |
|---|---|---|
| EP | 61127697 | 6/1986 |
| EP | 942077 | 9/1998 |
| FR | 2038156 | 1/1971 |
| JP | 5294780 | 9/1993 |

OTHER PUBLICATIONS

International Search Report, PCT/US01/03460 dated Jul. 25, 2001.

* cited by examiner

Primary Examiner—Robert Kunemund
(74) Attorney, Agent, or Firm—Senniger, Powers, Leavitt & Roedel

(57) ABSTRACT

A process for controlling the amount of insoluble gas trapped by a silicon melt is disclosed. After a crucible is charged with polycrystalline silicon, a gas comprising at least about 10% of a gas having a high solubility in silicon is used as the purging gas for a period of time during melting. After the polycrystalline silicon charge has completely melted, the purge gas may be switched to a conventional argon purge. Utilizing a purge gas highly soluble in silicon for a period of time during the melting process reduces the amount of insoluble gases trapped in the charge and, hence, the amount of insoluble gases grown into the crystal that form defects on sliced wafers.

23 Claims, 1 Drawing Sheet

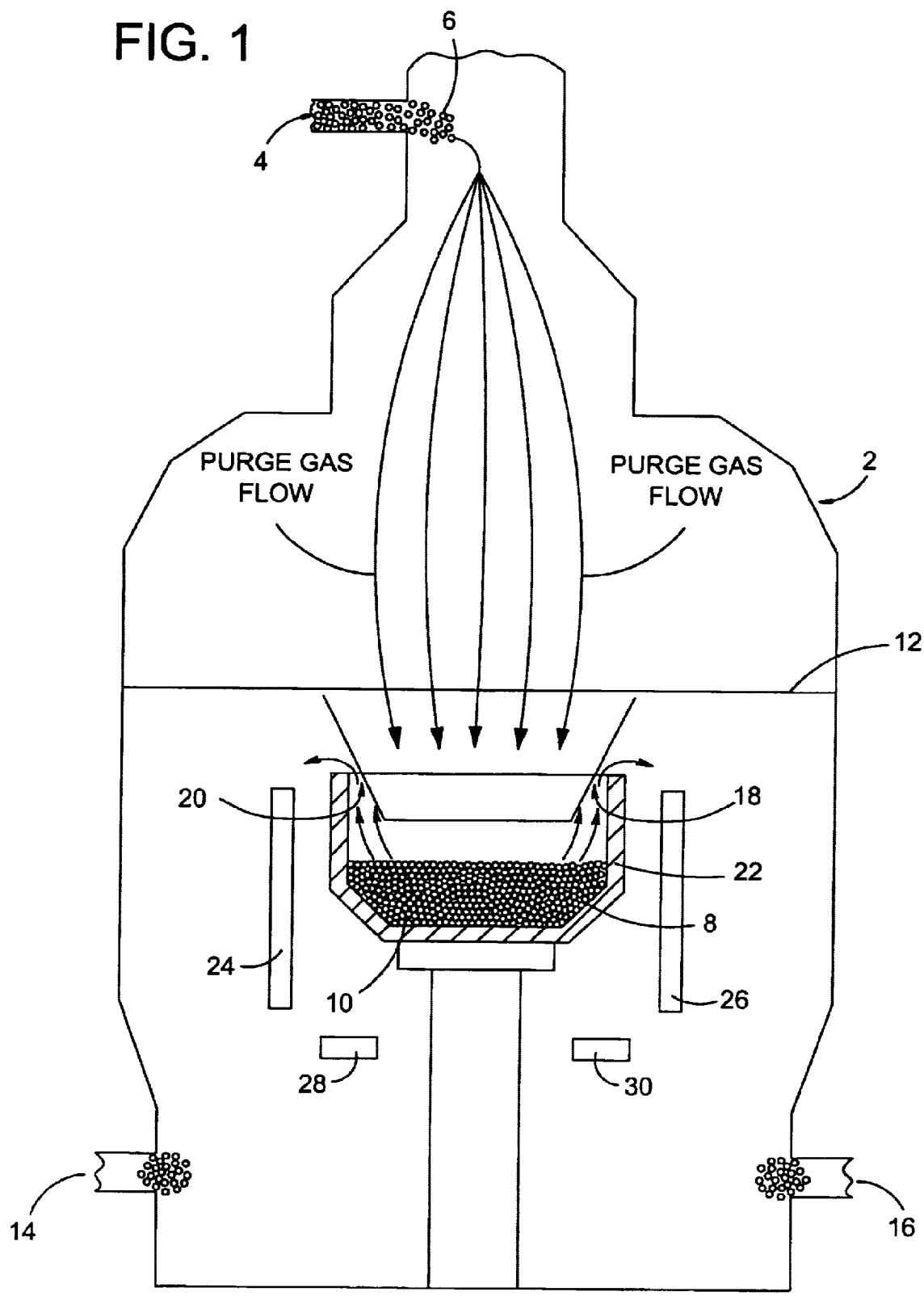

PROCESS FOR PREPARING A SILICON MELT

REFERENCE TO RELATED APPLICATIONS

This application is a continuation of Serial No. 09/503,566, filed Feb. 14, 2000 now U.S. Pat. No. 6,344,083.

BACKGROUND OF THE INVENTION

The present invention relates to a process for producing single crystal ingots having a reduced amount of crystal defects. More particularly, the present invention relates to a process for producing a silicon melt for growing single crystal silicon ingots wherein the silicon melt contains a very low amount of gases insoluble in silicon.

In the production of single silicon crystals grown by the conventional Czochralski method, polycrystalline silicon in the form of granular polysilicon, chunk polysilicon, or a mixture of chunk and granular polysilicon is first melted down within a quartz crucible and equilibrated at a temperature of about 1500° C. Chunk polysilicon is a polycrystalline silicon mass which is generally irregular in shape, with sharp, jagged edges as a result of the fact that it is prepared by breaking rods of polycrystalline silicon into smaller pieces; chunk polysilicon typically ranges from about 2 centimeters to about 10 centimeters in length and from about 4 centimeters to about 6 centimeters in width. Granular polysilicon is a polycrystalline silicon mass that is generally smaller, more uniform and smoother than chunk polysilicon as a result of the fact that it is typically prepared by chemical vapor deposition of silicon onto a silicon granule in a fluidized bed reactor; granular polysilicon typically ranges from about 1–5 millimeters in diameter and generally has a packing density which is about 20% higher than chunk polysilicon.

As the polysilicon is heated and melted, an inert purge gas such as argon is continuously introduced over the crucible and silicon to remove unwanted contaminants from the melt area that are produced in and around the melt during the melting of the polysilicon. After the silicon has completely melted and reached a temperature of about 1500° C., a seed crystal is dipped into the melt and subsequently extracted while the crucible is rotated to form a single crystal silicon ingot. During the early stages of the melting process when the polycrystalline charge is completely or partially in the solid state, the purge gas may become trapped in the polysilicon charge. The gas may be trapped between the individual polysilicon charge pieces themselves, or between the charge pieces and the sides or bottom of the crucible and eventually become insoluble bubbles in the melt which can be grown into the growing crystal. Although most of the insoluble bubbles, such as argon bubbles, present in the melt are released into the adjacent atmosphere during melting and temperature equilibration, some remain in the silicon melt and can be grown into the silicon crystal, thereby producing voids in the crystal.

While the problem of trapped gases occurs with all charge types including chunk silicon, polycrystalline silicon, and mixtures thereof, the problem is particularly acute with charges formed from only granulated polycrystalline silicon; the granular polysilicon with its high packing density tends to insulate the bottom and side walls of the crucible making it more difficult for insoluble gases such as argon to escape during the melting process. The purge gas, which has conventionally been argon because of its low price and non-reactive nature, is highly insoluble in silicon. Because argon is highly insoluble in silicon, trapped argon gas in the melt forms small bubbles in the liquid silicon during melting. Many of the insoluble gas bubbles contained in the liquid melt rise to the surface or are carried to the surface by convection and are released into the crystal growth gas ambient and thus have no detrimental effect on the growing ingot. A smaller number of the gas bubbles remain in the liquid melt throughout the pulling process and are grown into the crystal itself during growth. These bubbles, generally comprised of the insoluble argon purge gas, become trapped at the liquid-solid growth interface and cause large crystal voids on the crystal surface. Such defects are generally characterized and detected on sliced silicon wafers as large pits generally having a diameter of greater than about 1 micrometer. These pits are identified through laser scanning of polished wafers cut from the grown crystal. Such defects can effect 4% or more of wafers sliced from grown crystals and cause these slices to be unfit for grade one wafer product.

As such, a need exists in the semiconductor industry for a process of preparing a silicon melt for growing a single silicon crystal wherein the silicon melt contains a very low amount of gases insoluble in silicon.

SUMMARY OF THE INVENTION

Among the objects of the present invention, therefore, are the provision of a process for preparing a silicon melt containing a very low level of gases insoluble in silicon; the provision of a process for preparing a single silicon crystal containing a very low level of large crystal voids; the provision of a process for producing a silicon melt which produces a high percentage of grade one wafers; the provision of a simple, cost-effective process which reduces the number of defects in a grown single silicon crystal; and the provision of a process for preparing a silicon melt in which substantially all of the gas trapped in the silicon charge during the melting process is soluble in silicon.

The present invention, therefore, is directed to a process for controlling the amount of insoluble gas trapped by a silicon melt. The process comprises first charging a crucible with polycrystalline silicon and heating the crucible to melt the charge. During the melting of the polycrystalline charge a purge gas is flowed into the polycrystalline charge. The purge gas has a mole fraction of at least 0.1 of gas having a solubility in silicon of at least about $1 \times 10^{13}$ atoms/cm$^3$.

The present invention is further directed to a process for controlling the amount of insoluble gas trapped by a silicon melt wherein a crucible is first charged with polycrystalline silicon and the crucible heated to melt the charge. A purge gas having a mole fraction of at least 0.1 of a gas having a solubility in silicon of at least about $1 \times 10^{13}$ atoms/cm$^3$ is flowed into the charge during a heating phase and a melting phase of the polycrystalline melting process. The heating phase comprises the time period during the melting of the silicon before molten silicon is formed and the melting phase comprises the time period from the formation of molten silicon until the polycrystalline silicon charge is completely molten.

Other objects and features of this invention will be in part apparent and in part pointed out hereinafter.

BRIEF DESCRIPTION OF THE DRAWINGS

FIG. 1 is a schematic diagram of the flow pattern of a purging gas during the melting of a polycrystalline silicon charge in a crystal pulling apparatus.

Corresponding reference characters indicate corresponding parts throughout the drawings.

DETAILED DESCRIPTION OF THE PREFERRED EMBODIMENTS

In accordance with the present invention, it has been discovered that the number of large crystal voids which form in silicon single crystals during a Czochralski growth process as a result of the trapping of gases in the crystal can be significantly reduced or even eliminated by flowing a purge gas which has a high solubility in molten silicon into a polycrystalline silicon charge as the charge is being melted. Advantageously, the process of the present invention may be used in the formation of a mass of molten silicon in a crucible, i.e., a silicon melt, from polysilicon charges comprising chunk polysilicon, granular polysilicon, or a mixture of chunk and granular polysilicon.

In the process of the present invention, a crucible is charged with polysilicon and then heated to form molten silicon. Throughout the charge melting process during which the polysilicon charge is heated and melted, a purge gas is directed into the crucible. FIG. 1 shows the flow pattern of purge gas inside a crystal pulling apparatus 2 during the heating and melting of the polycrystalline silicon. Purge gas 6 enters the crystal pulling apparatus 2 through purge gas inlet 4 and flows down into the crucible 8 which contains polysilicon charge 10 through purge tube 12. Crucible 8 is supported by support structure 22 and heated by heaters 24, 26, 28, and 30. Purge tube 12 directs purge gas directly into crucible 8 and polycrystalline charge 10. The purge gas 6 has a Laminar flow pattern throughout the crystal pulling apparatus 2 and crucible 8 and carries contaminants produced during the melting of the polycrystalline charge away from the crucible area. Purge gas 6 exits crucible 8 containing polycrystalline charge 10 through open areas 18 and 20 and exits the crystal pulling apparatus 2 through purge gas outlets 14 and 16. The flow rates of the purge gases are generally set to achieve a pressure above the crucible of between about 1 and about 40 Torr, more preferably between about 10 and about 30 Torr, and most preferably about 25 Torr.

In accordance with the present invention, the purge gas comprises a gas having a relatively high solubility in molten silicon. Preferably, the purge gas comprises a gas having a solubility in molten silicon of at least about $1 \times 10^{13}$ atoms/$cm^3$, more preferably at least about $1 \times 10^{14}$ atoms/$cm^3$, more preferably at least about $1 \times 10^{15}$ atoms/$cm^3$, still more preferably at least about $1 \times 10^{16}$ atoms/$cm^3$, still more preferably at least about $1 \times 10^{17}$ atoms/$cm^3$, and most preferably at least about $6 \times 10^{18}$ atoms/$cm^3$ to ensure sufficient solubility of the gas into the silicon melt. Such gases include, for example, nitrogen, chlorine, helium, hydrogen, and neon with nitrogen being particularly preferred. Compound gases having the desired solubility such as $NH_3$ or HCl are also within the scope of the present invention. The purge gas may comprise a single gas or a mixture of soluble gases, or a mixture of argon and a soluble gas; if a mixture of argon and a soluble gas is used, it is generally preferred that the mole fraction of the soluble gas in the purge gas mixture be at least 0.2, 0.4, 0.5, or even 0.6. More preferably, the mole fraction of the soluble gas in the purge gas mixture is at least 0.7, 0.8, 0.9, or even about 1. Thus, for example, the purge gas may comprise a mixture of argon and nitrogen (and/or other gases having a high solubility in silicon). Regardless of the gases selected, the source gases preferably have a purity of at least about 99%, more preferably at least about 99.9%, and most preferably at least about 99.99%.

For purposes of the present invention, the polycrystalline charge melting step of a crystal growing process may be considered to comprise two phases: the heating phase and the melting phase. The heating phase of the melting process comprises the time period before molten silicon has formed in the crucible, including the time period before any heat is applied to the crucible, and the melting phase of the charge melting process comprises the time period from the formation of the first molten silicon until the polycrystalline silicon charge is completely molten.

In accordance with the present invention, the purge gas preferably comprises a gas having a high solubility in molten silicon during at least a part of the heating phase of the melting step of a crystal growing process. The heating phase of the charge melting step (i.e., before any molten silicon has formed in the crucible) is the stage at which the trapping of gas between polysilicon particles or at the sidewall formation or bottom is most problematic; during this stage, the purge gas may become trapped between polysilicon particles or along the sidewall formation or bottom of the crucible. As previously noted, insoluble purge gases trapped in these locations may inadvertently become incorporated into the growing crystal; soluble gases, however, will tend to dissolve into the melt thereby eliminating the bubble before it can become incorporated as such into the growing crystal. The use of purge gases having a high solubility in silicon during the heating phase thus significantly reduces or eliminates the presence of insoluble gases in the molten silicon and, consequently, the likelihood that a single silicon crystal grown from the molten silicon will contain crystal void defects. For at least a fraction of the heating phase, therefore, it is preferred that the mole fraction of gas(es) having a high solubility in molten silicon in the purge gas be at least 0.2, 0.4, 0.5, or even 0.6. More preferably, the mole fraction of gas(es) having a high solubility in molten silicon in the purge gas is at least 0.7, 0.8, 0.9, or even about 1 for at least 20%, 40%, 80%, or even 100% of the heating phase; that is, before molten silicon has formed in the crucible.

As the charge melting process continues, the melting phase begins and molten silicon is formed in the crucible and a layer of molten silicon begins to collect and grow along the bottom and sidewalls of the crucible. As more silicon continues to melt, the level of molten silicon in the center of the crucible grows. During this time period, the trapping of gases becomes less problematic as insoluble gases are less likely to be trapped between the crucible sidewalls or bottom and solid polysilicon particles. Also, insoluble gas trapping between polysilicon particles themselves becomes less problematic as the polysilicon charge becomes completely molten as the solid polysilicon particles remaining in the melt become wetted by the liquid silicon making it difficult for insoluble gas to penetrate between the particles and become trapped. Consequently, the benefit of including a gas having a high solubility in molten silicon in the purge gas decreases. Nevertheless, some benefit may be realized by including a gas having a high solubility in molten silicon in the purge gas during the melting phase, i.e., the phase between the point in time at which some molten silicon is formed in the crucible and the point in time at which the polysilicon charge is fully melted. For at least a fraction of this melting phase and preferably until at least the bottom of the crucible is covered by a layer of molten silicon, the mole fraction of gas(es) having a high solubility in molten silicon in the purge gas is preferably at least 0.2, 0.4, 0.4 or even 0.6. More preferably, the mole fraction of gas(es) having a high solubility in molten silicon in the purge gas is at least 0.7, 0.8, 0.9, or even about 1 for at least 5%, 10%, 20%, 40%, 80%, or even 100% of the melting phase of the charge melting process.

When the melting phase of the charge melting step of a crystal growing process is complete and the polysilicon charge is fully melted, no further purge gas can become trapped between the polysilicon charge and the crucible sidewalls or bottom, or between the polysilicon charge particles themselves. At this point, the purge gas can be switched to a conventional argon purge or other purge, without concern as to the purge gas solubility in silicon. If the preferred nitrogen purge gas is used during the heating and/or melting phases of the charge melting process, after the polycrystalline charge has fully melted and become molten it is generally preferred that the purge gas be switched to argon or another purge gas to control the amount of nitrogen dissolved in the melt. In one embodiment of the present invention, preferably no more than about $5 \times 10^{12}$ nitrogen atoms/cm$^3$ are dissolved into the liquid melt during melting. An excess incorporation of nitrogen into the molten silicon can lead to the formation of solid nitride particles which may make it difficult to grow dislocation free crystals.

In another embodiment of the present invention a soluble purge gas such as nitrogen can be used during the heating and melting of the charge melting step of a crystal growing process and during crystal growth to incorporate at least $1 \times 10^{10}$ atoms/cm$^3$, more preferably at least $5 \times 10^{13}$ atoms/cm$^3$, or more, into the growing crystal. The nitrogen doped crystal is then sliced into silicon wafers and subsequently processed by chamfering, lapping, etching, polishing or similar conventional processes to produce finished silicon wafers. After processing, the wafer is subjected to a heat treatment through the use of a rapid heating/rapid cooling apparatus to out-diffuse oxygen and nitrogen in the surface layers to eliminate defects in the wafer. This process is known in the art and fully set forth in EPO Patent No. 0942077.

Silicon melts prepared in accordance with the present invention utilizing a purging gas which has a high solubility in silicon for a period of time during charge melting contain a significantly reduced amount of insoluble gas as compared to melts prepared with the conventional argon purge. About 4% of silicon wafers sliced from single silicon crystals grown from conventionally prepared melts have at least 1 large pit making them unsuitable for grade one product. As such, for every 1000 silicon wafers produced from conventionally prepared melts about 40 are not useable as grade one product. Silicon wafers sliced from single silicon crystals grown from melts prepared in accordance with the present invention are substantially free from large pits. As used herein, the term "substantially free from large pits" means that the resulting number of wafers containing at least one large pit is reduced by at least 50%, more preferably at least 90%, and most preferably 100% from the number of pits on wafers produced from a silicon melt using the conventional argon purging gas for the entire melting process. As such, for each 1000 silicon wafers sliced from ingots grown from the silicon melts of the present invention, at least 20 more wafers, preferably at least 36 more, and most preferably 40 more wafers are useable as grade one product. The resulting wafers are substantially free from large pits as the amount of insoluble gases trapped in the melt and transferred into the growing ingot is significantly reduced or eliminated through the use of the melt of the present invention. Therefore, a much larger percentage of wafers sliced from the single crystal will be suitable for grade one material.

In accordance with the present invention, the silicon melt prepared using soluble purging gases during the melting of the polysilicon may be used in combination with the quartz crucible disclosed by Holder in U.S. Pat. No. 5,913,975. The crucible described in U.S. Pat. No. 5,913,975 is prepared by fusing the crucible in an atmosphere such as synthetic air which contains a very low level of argon. As such, the fused crucible is not a significant contributor of insoluble gases into the silicon melt during the melting of the polycrystalline silicon. The combination of the silicon melt of the present invention and the crucible disclosed by Holder in U.S. Pat. No. 5,913,975 may lead to a further reduction of gases insoluble in silicon being incorporated into a growing silicon ingot and, hence, the production of more grade 1 wafers per grown crystal.

The present invention is illustrated by the following example which is merely for the purpose of illustration and is not to be regarded as limiting the scope of the invention or manner in which it may be practiced.

EXAMPLE

In this Example two separate 32 kilogram silicon charges comprised of 100% granular polysilicon were each melted in a 14 inch diameter crucible in a Kayex-Hamco 3000 furnace and single crystal silicon ingots grown therefrom. To increase the probability of the formation of bubbles from insoluble gases, each crucible was coated on the inside side walls and bottom with a barium carbonate devitrification promoter. The silicon ingots were subsequently sliced into individual silicon wafers which were single side polished and inspected for large pits.

The first 32 kilogram charge of granular polysilicon was melted under a conventional argon purge flowing at a rate of about 32 slm and a pressure of about 25 Torr. The polysilicon was melted and allowed to equilibrate at a temperature of about 1500° C. The melting and equilibration process took about 3.5 hours. After the polysilicon had equilibrated, a 120 mm diameter crystal was grown to a length of about 1200 mm on the first attempt. The crystal was subsequently sliced and ground into 100 mm wafers which were single side polished and inspected by laser scanning on a Model CR 80 Laser Scanner (A.D. Optical) for large surface pits greater than 10 micrometers in diameter. The laser scanning determined that 3.2% of the polished silicon wafers had one or more pits having a diameter equal to or greater than 10 micrometers at the polished surface.

The second 32 kilogram charge of granular polysilicon was melted under a nitrogen purge at a flow rate of about 52 slm and a pressure of about 25 Torr for about 1 hour until there was a continuous layer of liquid polysilicon in contact with the sidewalls and bottom of the crucible. After about 1 hour, the purge was switched to a conventional argon purge at a flow rate of about 32 slm and a pressure of about 25 Torr. The polysilicon was completely melted and allowed to equilibrate at a temperature of about 1500° C. The melting and equilibration process took about 3.5 hours. After the polysilicon had equilibrated, a 120 mm diameter crystal was grown to a length of 1200 mm on the first attempt. The crystal was subsequently sliced and ground into 100 mm wafers which were single side polished and inspected by laser scanning on a Model CR 80 Laser Scanner (A.D. Optical) for large surface pits greater than 10 micrometers in diameter. The laser scanning determined that 0.7% of the polished silicon wafers had one or more pits having a diameter equal to or greater than 10 micrometers at the polished surface.

The results of this experiment show that the silicon wafers sliced from the single crystal produced from the melt prepared utilizing a purge gas having a high solubility in silicon had about 80% fewer large pits on the polished surface.

In view of the above, it will be seen that the several objects of the invention are achieved.

As various changes could be made in the above-described melt preparation process without departing from the scope of the invention, it is intended that all matter contained in the above description be interpreted as illustrative and not in a limiting sense.

What is claimed is:

1. A process for controlling the amount of insoluble gas trapped by a silicon melt, the process comprising:

charging a crucible with polycrystalline silicon;

heating the crucible to melt the polycrystalline silicon charge;

flowing a purging gas into the polycrystalline silicon charge as the polycrystalline silicon charge is melted, the purging gas having a mole fraction of at least about 0.1 of nitrogen, said purging gas flowing at a rate such that the pressure above said crucible is between about 1 and about 40 Torr.

2. The process as set forth in claim 1 wherein the purging gas has a mole fraction of at least about 0.2 of nitrogen.

3. The process as set forth in claim 1 wherein the purging gas has a mole fraction of at least about 0.5 of nitrogen.

4. The process as set forth in claim 1 wherein the purging gas has a mole fraction of at least about 0.9 of nitrogen.

5. The process as set forth in claim 1 wherein the purging gas is flowing at a rate such that the pressure above said crucible is between about 10 and about 30 Torr.

6. The process as set forth in claim 1 wherein the purging gas is flowing at a rate such that the pressure above said crucible is about 25 Torr.

7. The process as set forth in claim 1 wherein during at least 20% of a heating phase of the polycrystalline silicon melting the purging gas has a mole fraction of at least 0.1 of nitrogen, the heating phase comprising the time period during the polycrystalline silicon melting before molten silicon is formed.

8. The process as set forth in claim 7 wherein the purging gas has a mole fraction of at least a out 0.2 of nitrogen.

9. The process as set forth in claim 7 wherein the purging gas has a mole fraction of at least about 0.5 of nitrogen.

10. The process as set forth in claim 7 wherein the purging gas has a mole fraction of at least about 0.9 of nitrogen.

11. The process as set forth in claim 1 wherein during at least 20% of a melting phase of the polycrystalline silicon melting the purging gas has a mole fraction of at least 0.1 of nitrogen, the melting phase comprising the time period from the formation of molten silicon until the polycrystalline silicon charge is completely molten.

12. The process as set forth in claim 11 wherein the purging gas has a mole fraction of at least a out 0.2 of nitrogen.

13. The process as set forth in claim 11 wherein the purging gas has a mole fraction of at least a out 0.5 of nitrogen.

14. The process as set forth in claim 11 wherein the purging gas has a mole fraction of at least about 0.9 of nitrogen.

15. A process for controlling the amount of insoluble gas trapped by a silicon melt, the process comprising:

charging a crucible with polycrystalline silicon;

heating the crucible to melt the polycrystalline silicon charge;

flowing a purging gas into the polycrystalline silicon charge as the polycrystalline silicon charge is melted, the purging gas having a mole fraction of at least about 0.1 of nitrogen, said nitrogen having a purity of at least about 99%.

16. The process as set forth in claim 15 wherein the purging gas has a mole fraction of at least about 0.5 of nitrogen.

17. The process as set forth in claim 15 wherein the purging gas has a mole fraction of at least about 0.9 of nitrogen.

18. The process as set forth in claim 15 wherein the during at least 20% of a heating phase of the polycrystalline silicon melting the purging gas has a mole fraction of at least 0.1 of nitrogen, the heating phase comprising the time period during the polycrystalline silicon melting before molten silicon is formed.

19. The process as set forth in claim 15 wherein during at least 20% of a melting phase of the polycrystalline silicon melting the purging gas has a mole fraction of at least 0.1 of nitrogen, the melting phase comprising the time period from the formation of molten silicon until the polycrystalline silicon charge is completely molten.

20. A process for controlling the amount of insoluble gas trapped by a silicon melt, the process comprising:

charging a crucible with polycrystalline silicon;

heating the crucible to melt the polycrystalline silicon charge;

flowing a purging gas into the polycrystalline silicon charge as the polycrystalline silicon charge is melted, the purging gas having a mole fraction of at least about 0.1 of nitrogen, the purging gas flowing into the polycrystalline silicon charge such that no more than about $5 \times 10^{12}$ nitrogen atoms/cm$^3$ are dissolved into the polycrystalline silicon charge.

21. The process as set forth in claim 20 wherein the purging gas has a mole fraction of at least about 0.5 of nitrogen.

22. The process as set forth in claim 20 wherein the purging gas has a mole fraction of at least about 0.9 of nitrogen.

23. A process for controlling the amount of insoluble gas trapped by a silicon melt, the process comprising:

charging a crucible with polycrystalline silicon;

heating the crucible to melt the polycrystalline silicon charge;

flowing a purging gas into the polycrystalline silicon charge as the polycrystalline silicon charge is melted, the purging gas having a mole fraction of at least about 0.1 of nitrogen, said purging gas flowing at a rate such that the pressure about said crucible is between about 1 Torr and about 40 Torr and such that no more than about $5 \times 10^{12}$ nitrogen atoms/cm$^3$ are dissolved into the polycrystalline silicon charge.

* * * * *